United States Patent
Wang

(10) Patent No.: US 6,730,935 B1
(45) Date of Patent: May 4, 2004

(54) ANTI-PENETRATION STRUCTURE OF EL DEVICE

(75) Inventor: Chih Yuan Wang, Taichung Hsien (TW)

(73) Assignee: Wintek Corporation, Taichung (TW)

( * ) Notice: Subject to any disclaimer, the term of this patent is extended or adjusted under 35 U.S.C. 154(b) by 0 days.

(21) Appl. No.: 10/369,677

(22) Filed: Feb. 21, 2003

(51) Int. Cl.7 .................. H01L 33/00; H01L 33/12; H01L 27/15
(52) U.S. Cl. ............... 257/80; 257/79; 257/100; 257/431; 257/432; 257/433; 257/435
(58) Field of Search ............ 257/79–80, 100, 257/431, 432–433, 435

(56) References Cited

U.S. PATENT DOCUMENTS 6,498,114 B1 * 12/2002 Amundson et al. ......... 438/780
2001/0046579 A1 * 11/2001 Ishii et al. .................. 428/68
2002/0024096 A1 * 2/2002 Yamazaki et al. .......... 257/359
2002/0061451 A1 * 5/2002 Kita et al. ................... 430/2
2002/0163614 A1 * 11/2002 Hinata et al. ............... 349/139
2002/0171798 A1 * 11/2002 Tanaka et al. .............. 349/153

* cited by examiner

Primary Examiner—Amir Zarabian
Assistant Examiner—Ida M. Soward
(74) Attorney, Agent, or Firm—Rosenberg, Klein & Lee

(57) ABSTRACT

An anti-penetration structure of EL device includes a transparent substrate, a front electrode layer, a lighting layer, an inducing layer, a back electrode layer and an insulating packaging layer which are sequentially overlaid on the substrate. A voltage-durable layer is disposed between the front electrode layer and the lighting layer. The voltage-durable layer is formed of a mixture of more than one voltage-durable material to form an anti-penetration structure.

4 Claims, 2 Drawing Sheets

ANTI-PENETRATION STRUCTURE OF EL DEVICE

BACKGROUND OF THE INVENTION

The present invention is related to an anti-penetration structure of EL device, in which a voltage-durable layer is disposed between a front electrode layer and a lighting layer. The voltage-durable layer is able to enhance the voltage-durability of the EL device and prevent the lighting layer from being penetrated.

FIG. 2 shows a conventional electro luminescent (EL) device. The conventional EL device is composed of a transparent substrate 81, a front electrode layer 82, a lighting layer 83, an inducing layer 84, a back electrode layer 85 and an insulating packaging layer 86 which are sequentially overlaid on the transparent substrate 81. By means of applying an AC voltage between the front and back electrode layers 82, 85, the numerous lighting particles 831 of the lighting layer 83 are energized to emit light through the transparent substrate 81.

Due to structural or material factors, the lighting layer 83 has some shortcomings as follows:
1. The material has insufficient electricity-durability.
2. Bubbles are produced when manufacturing the lighting layer 83.
3. The alien materials or impurities in the solvent will contaminate the lighting layer 83.
4. The purity of the lighting material is insufficient.
5. The thickness of the material is uneven or holes are formed on the material.

Due to the above shortcomings, in dynamic test, instantaneous leakage of current will take place in the EL device to penetrate and burn down the lighting layer 83. This lowers the ratio of good product and increases manufacturing cost.

SUMMARY OF THE INVENTION

It is therefore a primary object of the present invention to provide an anti-penetration structure of EL device, in which a voltage-durable layer is disposed between the front electrode layer and the lighting layer. The voltage-durable layer is made of a mixture of more than one voltage-durable material and is able to enhance the voltage-durability of the EL device so as to prevent the lighting layer from being penetrated.

According to the above object, the anti-penetration structure of EL device of the present invention includes a transparent substrate, a front electrode layer, a lighting layer, an inducing layer and a back electrode layer, which are sequentially overlaid on the substrate. The lighting layer, inducing layer and back electrode layer are enclosed by an insulating packaging layer. A voltage-durable layer is disposed between the front electrode layer and the lighting layer. The voltage-durable layer is formed of a mixture of more than one voltage-durable material.

The present invention can be best understood through the following description and accompanying drawings wherein:

DETAILED DESCRIPTION OF THE PREFERRED EMBODIMENTS

Figure 1:
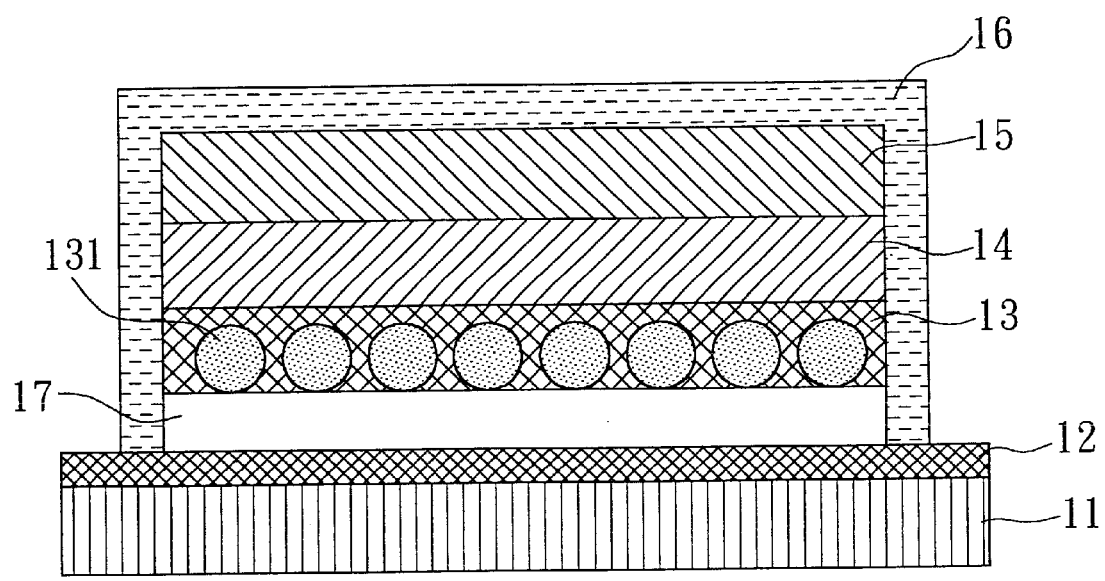
FIG. 1 is a sectional view of the anti-penetration structure of EL device of the present invention.
Figure 2:
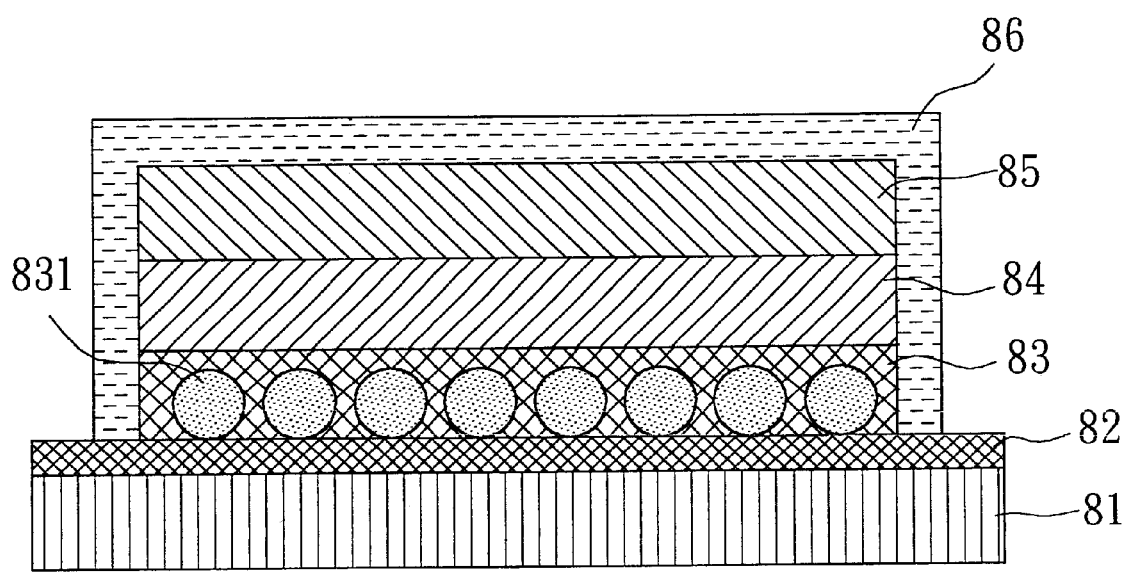
FIG. 2 is a sectional view of a conventional EL device.

Please refer to FIG. 1. The anti-penetration structure of EL device of the present invention includes a transparent substrate 11, a front electrode layer 12, a lighting layer 13, an inducing layer 14 and a back electrode layer 15 which are sequentially overlaid on the substrate 11. The lighting layer 13, inducing layer 14 and back electrode layer 15 are enclosed by an insulating packaging layer 16. A voltage-durable layer 17 is disposed between the front electrode layer 12 and the lighting layer 13.

The voltage-durable layer 17 is formed of mixture of gum material and 5~50 weight percentage of solution of more than one of polyamide resin, polyester resin, polyether resin, epoxy resin, halogen-containing resin, rubber, silicone, acrylic resin, cyanoresin and fiber resin.

The voltage-durable layer 17 is disposed between the front electrode layer 12 and the lighting layer 13. Therefore, when an AC voltage is applied between the front and back electrode layers 12, 15 to drive the numerous lighting particles 131 of the lighting layer 13 to emit light, even if the structure of the lighting layer 13 is not compact or the lighting layer 13 has material problems, the voltage-durable layer 17 can still provide sufficient electricity-durability so as to avoid instantaneous leakage of current and prevent the lighting layer 13 from being penetrated and burned down.

Alternatively, the voltage-durable layer 17 can be formed of mixture of gum material and 0.1~50 weight percentage of powder of more than one of metal oxide, metal nitride, metal nitrogen oxide and metal hydroxide. This voltage-durable layer 17 can also achieve the same voltage-durability and prevent the lighting layer 13 from being penetrated.

Furthermore, the voltage-durable layer 17 can be alternatively solely formed of any of epoxy resin, PU, acrylic, phenolic resin, epoxy acrylic and urea-formaldehyde resin. This voltage-durable layer 17 can also achieve the same voltage-durability and prevent the lighting layer 13 from being penetrated.

The above embodiments are only used to illustrate the present invention, not intended to limit the scope thereof. Many modifications of the above embodiments can be made without departing from the spirit of the present invention.

What is claimed is:

1. An anti-penetration structure of an EL device comprising a transparent substrate, a front electrode layer, a lighting layer, an inducing layer and a back electrode layer which are sequentially overlaid overlaid on the substrate, the lighting layer, inducing layer and back electrode layer being enclosed by an insulating packaging layer, a voltage-durable layer being disposed between the front electrode layer and the lighting layer, the voltage-durable layer being formed of mixture of gum material and 5~50 weight percentage of solution of more than one of polyamide resin, polyester resin, epoxy resin, polyether resin, halogen-containing resin, rubber, silicone, acrylic resin, cyanoresin and fiber resin.

2. The anti-penetration structure of an EL device as claimed in claim 1, wherein the voltage-durable layer is formed of mixture of gum material and 0.1~50 weight percentage of power of more than one of metal oxide, metal nitride, metal nitrogen oxide and metal hydroxide.

3. An anti-penetration structure of an EL device comprising a transparent substrate, a front electrode layer, a lighting layer, an inducing layer and a back electrode layer which are sequentially overlaid overlaid on the substrate, the lighting layer, inducing layer and back electrode layer being enclosed by an insulating packaging layer, a voltage-durable layer being disposed between the front electrode layer and the lighting layer, the voltage-durable layer being formed of mixture of gum material and 0.1~50 weight percentage of power of more than one of metal oxide, metal nitride, metal nitrogen oxide and metal hydroxide.

4. The anti-penetration structure of an EL device as claimed in claim 3, wherein the voltage-durable layer if formed of mixture of gum material and 5~50 weight percentage of solution of more than one of polyamide resin, polyester resin, epoxy resin, polyether resin, halogen-containing resin, rubber, silicone, acrylic resin, cyanoresin and fiber resin.

* * * * *